(12) United States Patent
Kuo et al.

(10) Patent No.: US 10,510,553 B1
(45) Date of Patent: Dec. 17, 2019

(54) DRY ASHING BY SECONDARY EXCITATION

(71) Applicant: Taiwan Semiconductor Manufacturing Company, Ltd., Hsinchu (TW)

(72) Inventors: Jack Kuo-Ping Kuo, Hsinchu (TW); Sheng-Liang Pan, Hsinchu (TW); Chia-Yang Hung, Kaohsiung (TW); Jyu-Horng Shieh, Hsinchu (TW); Shu-Huei Suen, Jhudong Township (TW); Syun-Ming Jang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/993,178

(22) Filed: May 30, 2018

(51) Int. Cl.
*H01L 21/311* (2006.01)
*H01L 21/67* (2006.01)
*H01J 37/32* (2006.01)

(52) U.S. Cl.
CPC .... *H01L 21/31138* (2013.01); *H01J 37/3244* (2013.01); *H01J 37/32715* (2013.01); *H01L 21/67069* (2013.01); *H01J 2237/20235* (2013.01); *H01J 2237/3341* (2013.01); *H01L 21/31144* (2013.01)

(58) Field of Classification Search
CPC ................................................ H01L 21/31138
USPC ........................................................ 438/725
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2009/0139453 A1* | 6/2009 | Chen | C23C 16/36 |
| | | | 118/723 I |

* cited by examiner

*Primary Examiner* — Roberts P Culbert
(74) *Attorney, Agent, or Firm* — Slater Matsil, LLP

(57) ABSTRACT

An ashing process and device forms radicals of an ashing gas through a secondary reaction. A plasma is generated from a first gas, which is diffused through a first gas distribution plate (GDP). The plasma is diffused through a second GDP and a second gas is supplied below the second GDP. The first gas reacts with the second gas to energize the second gas. The energized second gas is used in ashing a resist layer from a substrate.

20 Claims, 16 Drawing Sheets

DRY ASHING BY SECONDARY EXCITATION

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. Oxygen plasma etching (or ashing) can be used for removal of resist materials used in a photolithography process, however, such processes may undesirably erode underlying structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
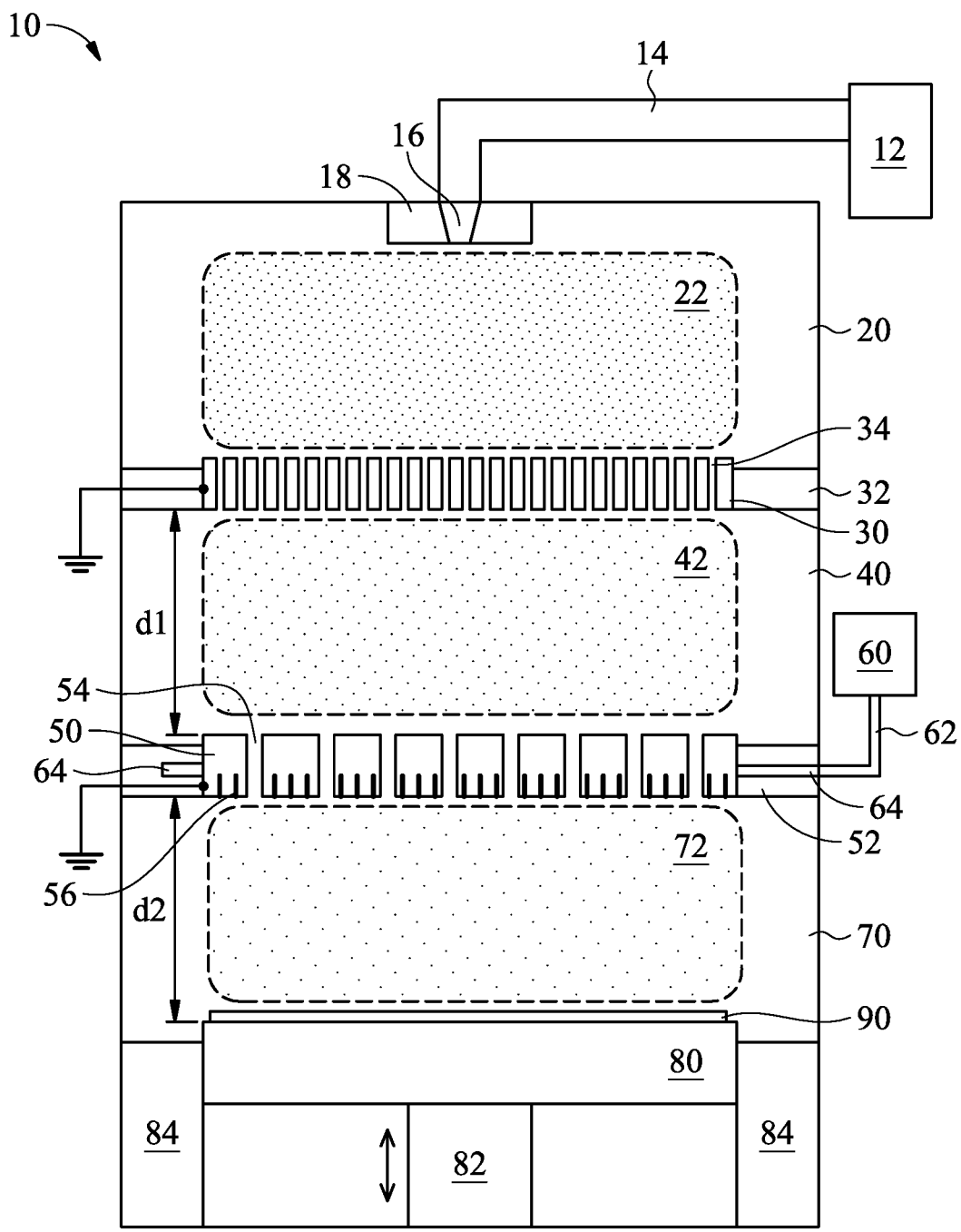
FIG. 1 illustrates an ashing chamber in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fabrication of various solid state devices uses planar substrates, such as semiconductor wafers, on which integrated circuits are fabricated. Various processing steps are used to fabricate integrated circuits on a semiconductor wafer. These steps include patterning of the semiconductor wafer or depositing and patterning various layers on the semiconductor wafer. Patterning of these elements is performed by formation of a photoresist or other masking layers, patterning the photoresist or other masking layers by using standard lithographic or photolithographic techniques, and etching the underlying material exposed by the pattern, thereby etching the underlying wafer or layers in the pattern of the masked pattern on the substrate. The mask is then removed or stripped from the substrate to expose the top surface of the patterned layer.

Embodiments provide a stripping device and method which strips a resist layer through an ashing process using an etching or ashing gas which is excited through a secondary reaction. The resist layer, for example, may be a photoresist or bottom anti-reflective coating (B ARC) layer which is stripped after a photolithography process. Embodiments are able to strip the resist layer with reduced damage or no damage to the underlying structures in the process. Resist layers may be stripped by a dry ashing process where the layer is decomposed, for example by oxidation or similar process, in a stripping or etching chamber. Even though an ashing gas may be selective to the material of the resist layer to generally exclude exposed materials underlying the resist layer, high-energy radicals of the ashing gas may cause decomposition of underlying structures. Embodiments use a secondary reaction to excite the ashing gas, thereby reducing or preventing high energy radicals of the ashing gas from forming. As such, the underlying structures are eroded less or not at all when the resist layer is stripped.

In a typical ashing process, for example, a wafer may be subjected to a high density plasma source and gas to deliver radicals for ashing. However, the process of producing the high density plasma in the presence of an ashing gas produces ions, ultraviolet (UV) radiation, low energy radicals, and high energy radicals which may undesirably attack the underlying substrate or layers, thereby causing material loss of these layers. Material loss is undesirable because it may affect yield of valid devices from the wafer. Moreover material loss may be better or worse in different areas of the wafer, for which compensation may be difficult, and for which differences in material loss across the wafer may be magnified as subsequent layers are applied and patterned.

Another problem with material loss may occur when a resist layer may need to be reworked prior to etching the underlying layers. For example, a resist layer may be patterned and then the pattern analyzed for pattern accuracy or defects. If the resist layer needs to be removed and reworked, the removal process may cause undesirable premature patterning due to material loss in the underlying layers.

Because embodiments use an ashing gas which is excited to form radicals of the ashing gas through a secondary reaction, high energy radicals of the ashing gas are not formed. As such, because primarily only lower energy radicals of the ashing gas are formed, the underlying layers below the resist are not eroded when the resist layer is stripped by the ashing process.

After patterning a target layer and removing the pattern mask by ashing, subsequent processing steps are then performed, including depositing and patterning subsequent layers and so forth. This process is used to cumulatively apply multiple electrically conductive layers and insulating layers on the wafer and pattern the layers to form circuits. The final yield of functional circuits on the wafer depends on proper application of each layer during the process steps.

FIG. 1 illustrates an ashing chamber 10 in accordance with some embodiments. Chamber 10 includes an upper area 20 where plasma is generated in plasma region 22. A gas (referred to as Gas A) is supplied by gas supply 12 through a gas line 14 and out one or more gas supply nozzles 16 into the upper area 20. A plasma is created in the chamber by a plasma source 18 which produces a plasma of Gas A. Gas A may include an inert non-ashing gas having multiple excitation states, such as argon (Ar), helium (He), krypton (Kr), xenon (Xe), or radon (Rn), other gases having multiple excitation states, such as nitrogen molecules ($N_2$), or combinations thereof.

Chamber 10 also includes a middle area 40. The upper area 20 and middle area 40 are separated by a gas distribution plate (GDP) 30. GDP 30 is retained in a holder 32 and has multiple through-holes 34 from top to bottom to provide plasma products produced in the plasma region 22 to a low ion region 42 in the middle area 40. GDP 30 is described in greater detail below. GDP 30 functions to distribute plasma products according to the placement of through-holes 34. The sizes and disposition of through-holes 34 are selected to distribute plasma products to the low ion region 42, according to a desired distribution. Ions are not desired. As such, GDP 30 is grounded and will neutralize some of the ions as they strike GDP 30. GDP 30 may also absorb or neutralize some of the energy of the radicals and reduce UV radiation passing to the middle area 40. Through-holes 34 of GDP 30 allow radicals and may allow some of the plasma, ions, and UV radiation to pass through through-holes 34 into low ion region 42. In some embodiments, about 10% to 30% of the radicals, plasma, ions, and UV radiation will pass through to low ion region 42, depending on the design of GDP 30. In some embodiments less than 10% or more than 30% of the plasma, ions, and UV radiation may pass through to low ion region 42. As such, GDP 30 reduces the number of ions and UV radiation in low ion region 42.

Chamber 10 also includes a lower area 70. The middle area 40 and lower area 70 are separated by another GDP, GDP 50. GDP 50 is retained in a GDP holder 52 and has multiple through-holes 54 from top to bottom to distribute radicals from the low ion region 42 to a substrate processing region 72. GDP 50 also has multiple small holes 56 interspersed throughout the bottom of GDP 50. Holes 56 distribute a second gas (referred to as Gas B) to the substrate processing region 72. GDP 50 is described in greater detail below in conjunction with FIGS. 4 through 11b.

The distance d1 is the distance between GDP 30 and GDP 50, and is also understood as being the height of the middle area 40. The distance d1 may be configurable by moving GDP 30 or GDP 50 up or down in chamber 10 prior to processing. In some embodiments, distance d1 may be between about 2 cm and 6 cm, such as about 4 cm. Other distances may be used. The distance d1 may be selected depending on the composition chosen for Gas A and Gas B.

In some embodiments, through-holes 34 of GDP 30 and through-holes 54 of GDP 50 may be aligned, while in other embodiments, GDP 50 may be placed without regard to GDP 30, so that the through-holes 34 may or may not be are aligned to or overlapping with through-holes 54.

Gas B is provided by a gas source 60 by a gas line 62. Gas B enters through side channels in GDP 50, which are routed to holes 56. In some embodiments, GDP holder 52 may incorporate a gas channel 64 which provides Gas B to the side channels of GDP 50. In some embodiments, Gas B may be routed directly to GDP 50, which may have channels and to distribute Gas B to holes 56. Gas B may include any suitable ashing gas different from Gas A, such as oxygen ($O_2$), nitrogen ($N_2$), hydrogen ($H_2$), nitrogen trifluoride ($NF_3$), tetrafluoromethane ($CF_4$), another fluorocarbon, a hydrofluorocarbon ($C_xH_yF_z$), or combinations thereof.

GDP 50 functions to distribute plasma products from the low ion region 42 according to the placement of through-holes 54. GDP 50 is grounded and will neutralize some of the ions as they strike GDP 50. GDP 50 may also absorb some of the energy of the radicals and UV radiation passing to the lower area 70. Through-holes 54 of GDP 50 allow radicals and may allow some of the plasma, ions, and UV radiation to pass through through-holes 54 into substrate processing region 72. In some embodiments, about 10% to 20% of the radicals, plasma, ions, and UV radiation from low ion region 42 will pass through to substrate processing region 72, depending on the design of GDP 50 and alignment of through-holes 54 of GDP 50 to through-holes 34 of GDP 30. In some embodiments, more than 20% or less than about 10% of the ions and UV radiation from low ion region 42 will pass through to substrate processing region 72. As such, GDP 50 further reduces the number of ions and UV radiation in substrate processing region 72.

In operation of chamber 10, Gas B enters substrate processing region 72 in an unenergized state and collides with energized radicals of Gas A entering substrate processing region 72 from low ion region 42. Gas B species are therefore indirectly energized by way of the Gas A radicals. This process is described in greater detail below in conjunction with FIG. 12.

Still referring to FIG. 1, at the bottom of lower area 70 is a pedestal 80 which retains a substrate 90. In some embodiments pedestal 80 is movable by arm 82, which may move the substrate up or down. Pedestal 80 is housed within chamber side members 84. In some embodiments, pedestal 80 may include temperature control features to heat or cool the pedestal. In some embodiments, pedestal 80 may be maintained between about 100° C. to about 300° C., such as about 250° C., during processing. Other temperatures may be used as appropriate. The distance d2 is the distance between pedestal 80 and GDP 50 and may be changed by moving pedestal 80 up or down. In some embodiments, distance d2 may be between about 2 cm and 10 cm, such as about 6 cm. Other distances may be used. Moving pedestal 80 closer to GDP 50 will provide faster, more aggressive ashing, while moving pedestal 80 further from GDP 50 will provide slower, less aggressive ashing. In some embodiments, chamber 10 may be configured to move the pedestal 80 during processing, for example, so that substrate 90 is closer to GDP 50 at the start of processing and moves away from GDP 50 during processing.

Chamber 10 may include additional components necessary for operation, such as an exhaust, vacuum pump, inductors, coils, and so forth which would be understood by a person of ordinary skill in the art.

FIGS. 2a through 3c illustrate various embodiments and views of GDP 30, in accordance with some embodiments. GDP 30 may be comprised of any suitable material. In some embodiments, GDP 30 is comprised of a conductive material, such as aluminum, and has a thickness between about 5 mm and 20 mm, such as about 6.4 mm. Other thicknesses may be used. In some embodiments, GDP 30 may have a circular shape in top-down view and have a diameter between about 280 mm and 320 mm, such as about 300 mm. Other shapes and dimensions may be used for GDP 30.

Figure 2A:
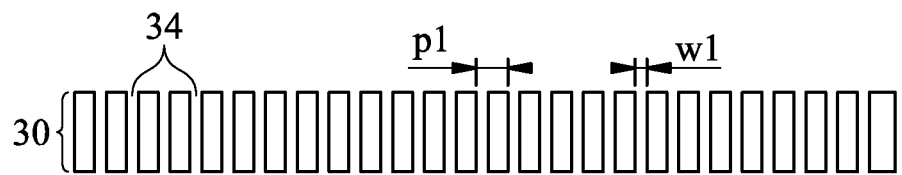
FIGS. 2a through 3c illustrate various embodiments and views of a gas distribution plate, in accordance with some embodiments.

FIG. 2a illustrates a cross-section of GDP 30 where through-holes 34 of GDP 30 are dispersed in a regular pattern and have a standard size. The cross-section of FIG. 2a can be taken along a line A-A, for example, in FIG. 3a. The pitch p1 between holes may be between about 5 mm and 30 mm, such as about 10 mm. Other values for the pitch p1 may be used. The value of pitch p1 may vary depending on the cross-section taken. The width w1 of each hole may be between about 1 mm and about 10 mm, such as about 3 mm. Other widths of the through-holes may be used. Although through-holes 34 are illustrated as being cylindrical, in some embodiments, through-holes 34 may be funnel shaped, such as illustrated below with respect to through-holes 54 of FIG. 8. Through-holes 34, such as discussed below with respect to FIGS. 2b and 2c, may also be funnel shaped in some embodiments.

Figure 3A:
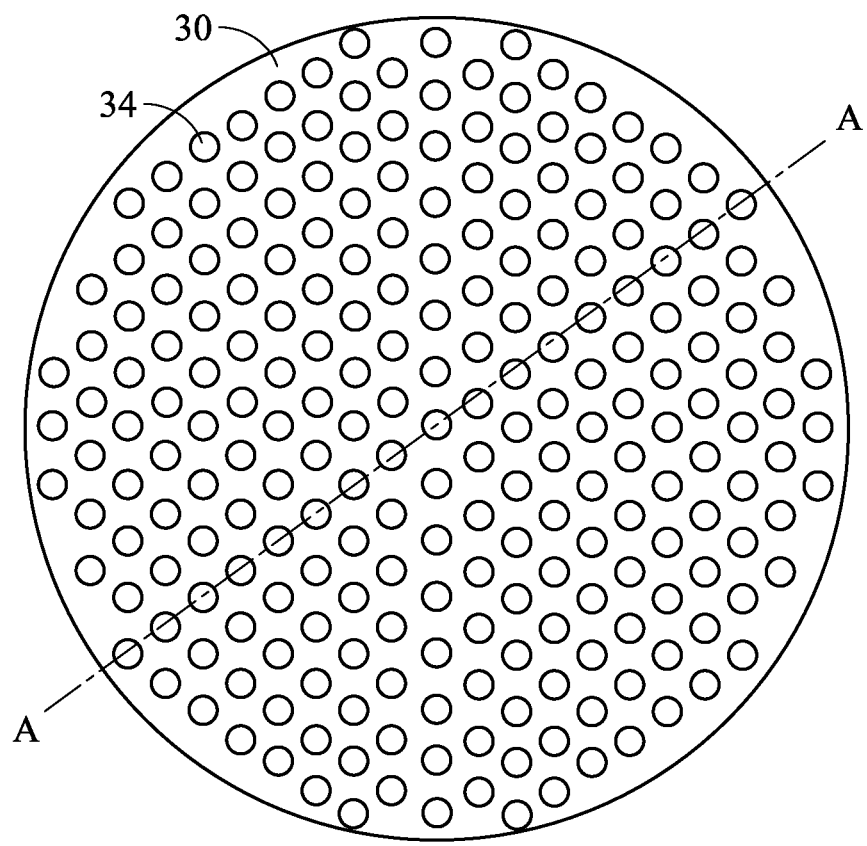

FIG. 3a illustrates a top-down view of GDP 30, in accordance with some embodiments. As illustrated in FIG. 3a, a pattern of through-holes 34 is shown. Other patterns may be used, such as circular patterns.

Figure 2B:
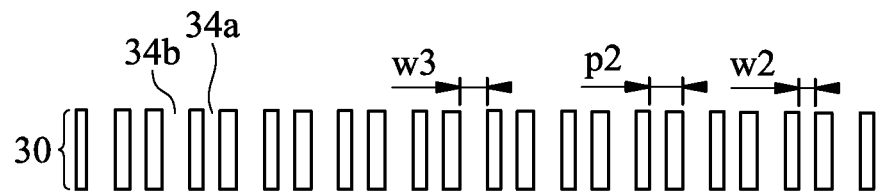

FIG. 2b illustrates a cross-section of GDP 30 where through-holes 34 of GDP 30 are dispersed in a combination of patterns of through-holes 34 having multiple sizes. The cross-section of FIG. 2b can be taken along a line B-B, for example, in FIG. 3b. The pitch p2 between a through-hole 34a of one pattern to a through-hole 34b of another pattern may be between about 3 mm and 15 mm, such as about 10 mm. The pitch p3 between a through-hole 34b to a through-hole 34a may be between about 15 mm and 80 mm, such as about 40 mm. Other values for pitch p2 and pitch p3 may be used. The value of pitch p2 and the value of pitch p3 may vary depending on the cross-section taken. The width w2 of each through-hole 34a in a first pattern may be between about 1 mm and about 10 mm, such as about 3 mm. The width w3 of each through-hole 34b in a second pattern may be between about 1 mm and about 10 mm, such as about 3 mm. Other widths of the through-holes may be used. In some embodiments, additional patterns of through-holes 34 may be used on conjunction with the patterns of through-holes 34a and through-holes 34b. In some embodiments, some patterns may be used in certain parts of GDP 30, while in other parts of GDP 30, other patterns may be used. For example, a pattern or set of patterns of through-holes 34 toward the outer edge of GDP 30 may be different from the pattern or set of patterns of through-holes 34 used toward the inner portion of GDP 30

Figure 3B:
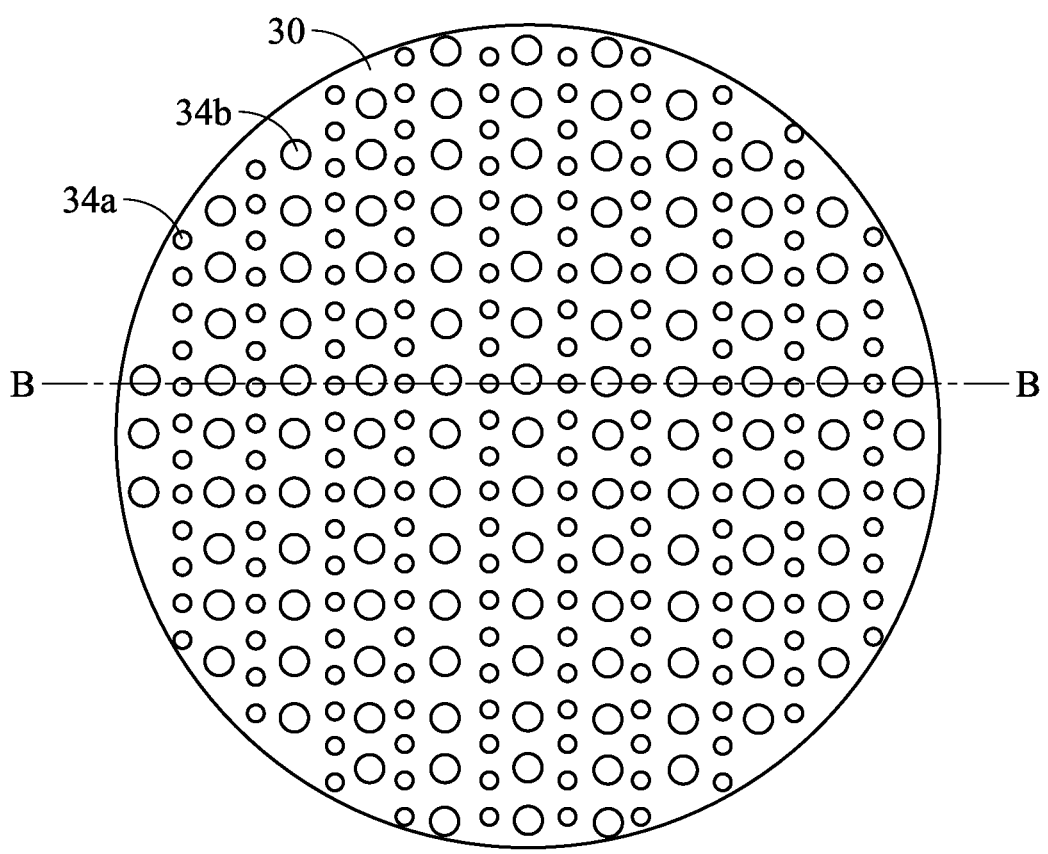

FIG. 3b illustrates a top-down view of GDP 30 of FIG. 2b, in accordance with some embodiments. As illustrated in FIG. 3b, a pattern of through-holes 34a is shown and another pattern of through-holes 34b is shown as being interspersed with the pattern of through-holes 34a. Other patterns may be used, such as circular patterns.

Figure 2C:
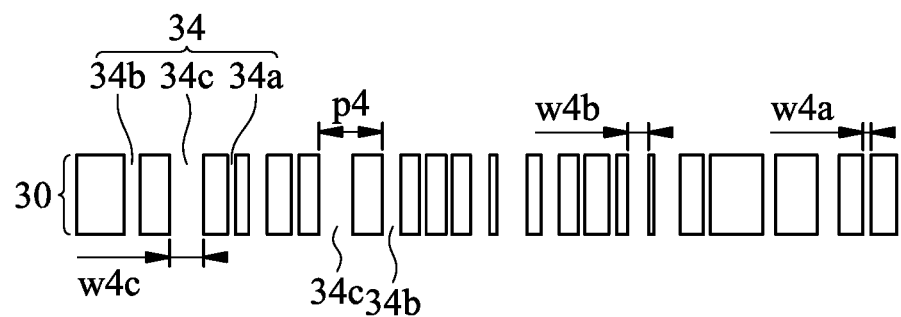

FIG. 2c illustrates a cross-section of GDP 30 where through-holes 34 of GDP 30 are dispersed randomly. Through-holes 34 may also have multiple sizes or the same size. The cross-section of FIG. 2c can be taken along a line C-C, for example, in FIG. 3c. The pitch p4 between one through-hole 34 to another, for example, through-hole 34c to 34b, may be between about 3 mm and 15 mm, such as about 10 mm. The pitches between through-holes 34 will range from one hole to another due to the random distribution of through-holes 34. In some embodiments, multiple sizes of through-holes 34 may have different widths. For example, the width w4a of a small sized through-hole 34a may be between about 1 mm and about 10 mm, such as about 3 mm. The width w4b of a medium sized through-hole 34b may be between about 1 mm and about 10 mm, such as about 4 mm. The width w4c of a large sized through-hole 34c may be between about 1 mm and about 10 mm, such as about 5 mm. Other widths may be used for the through-holes 34.

Figure 3C:
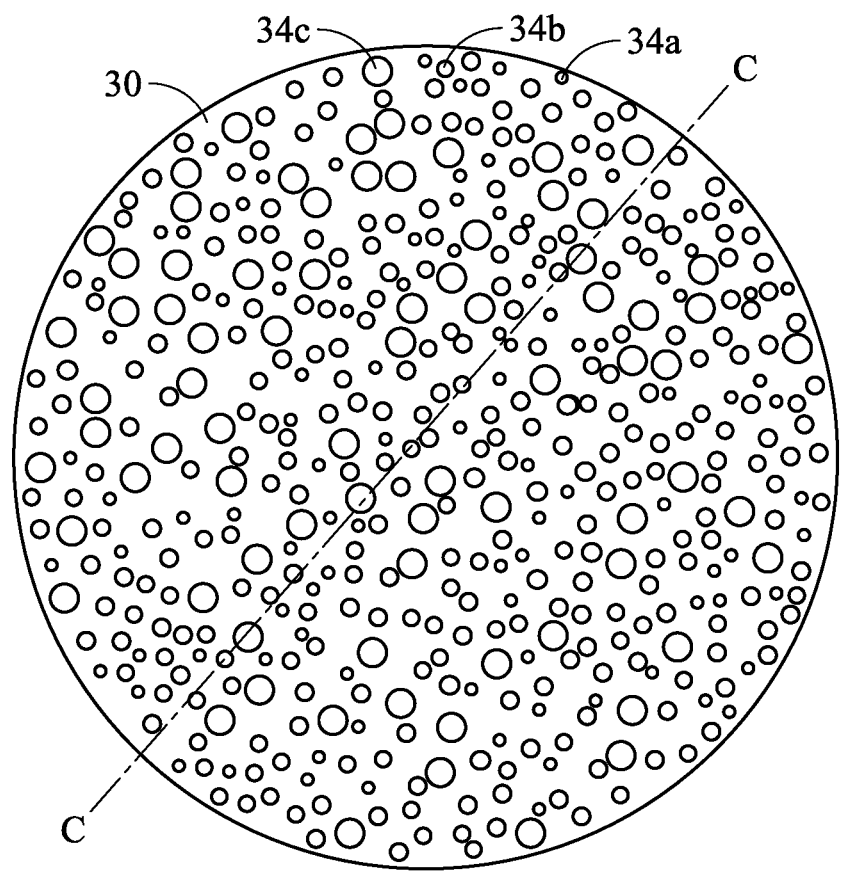

FIG. 3c illustrates a top-down view of GDP 30 of FIG. 2c, in accordance with some embodiments. As illustrated in FIG. 3c, a random distribution of through-holes 34 is shown in various sizes, including small sized through-hole 34a, medium sized through-hole 34b, and large sized through-hole 34c. More or fewer different sizes may be used for through-holes 34. For example, in some embodiments, all of small sized through-holes 34a are the same width, all of medium sized through-holes 34b are the same width, and all of large sized through-holes 34c are the same width. In some embodiments, each of the small sized through-holes 34a may have varying widths within a range, each of the medium sized through-holes 34b may have varying widths within another range, and each of the large sized through-holes 34c may have varying widths within yet another range. In some embodiments, the sizes of all through-holes 34 may be the same.

In some embodiments, the GDP 30 may have through-holes 34 selected and distributed based on a combination of the through-holes 34 described above in conjunction with FIG. 2a through 3c. Although the through-holes 34 are illustrated as being perpendicular to the top or bottom surface of GDP 30, it should be understood that through-holes 34 may also not be perpendicular to the top or bottom surface of GDP 30, in accordance with some embodiments.

FIGS. 4 through 9 illustrate various embodiments and views of GDP 50, in accordance with some embodiments. GDP 50 may be comprised of any suitable material. In some embodiments, GDP 50 is comprised of a conductive material, such as aluminum, and has a thickness between about 10 mm and 30 mm, such as about 15 mm. Other thicknesses may be used. In some embodiments, GDP 50 may have a circular shape in top-down view and have a diameter between about 280 mm and 320 mm, such as about 300 mm. Other shapes and dimensions may be used for GDP 50.

Figure 4:
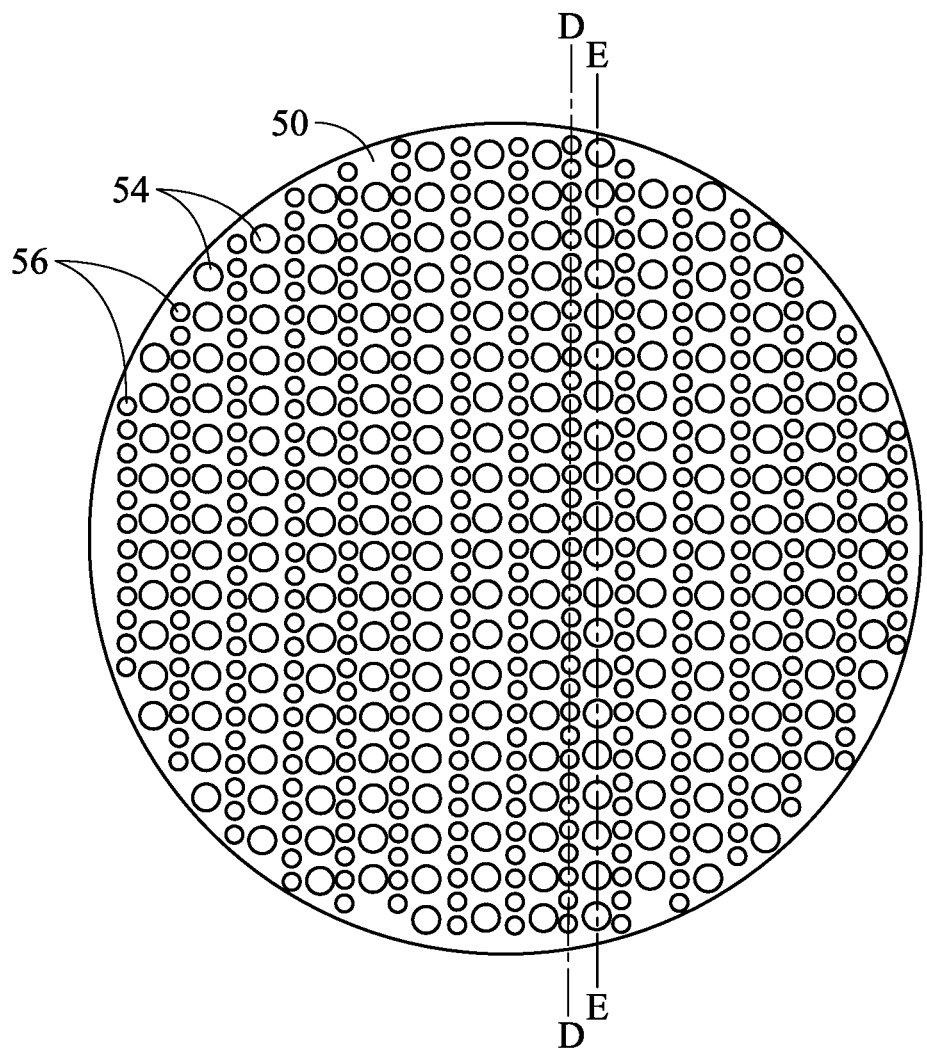
FIGS. 4 through 9 illustrate various embodiments and views of a gas distribution plate, in accordance with some embodiments.

FIG. 4 is an illustration of a bottom-up view of GDP 50, in accordance with some embodiments. In some embodiments, holes 56 may be distributed substantially uniformly on the bottom of GDP 50. Through-holes 54 may be interspersed among holes 56. It should be understood that, although the holes 56 and through-holes 54 are illustrated as being in a pattern, any suitable distribution of holes 56 and through-holes 54 may be used, including a distribution similar to the through-holes 34, described above with respect to FIGS. 2a through 3c. Distributions of through-holes 54 and holes 56 may be selected based on the composition of Gas A and composition of Gas B.

Figure 5:
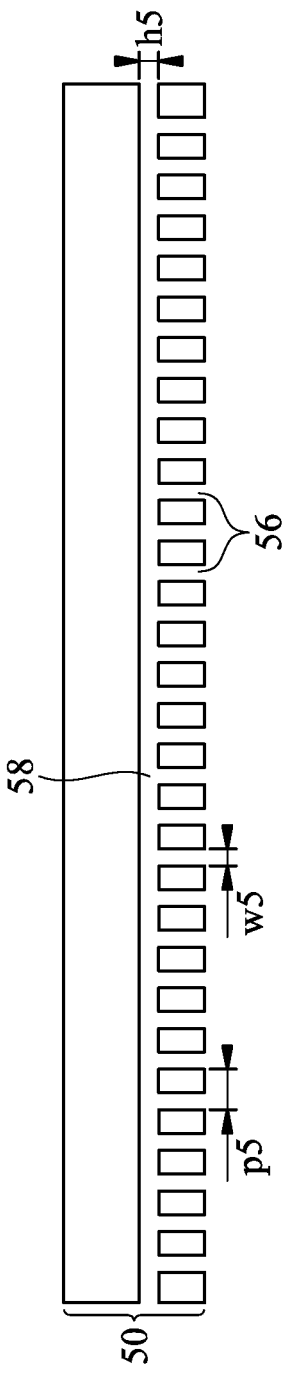

FIG. 5 through FIG. 8 illustrate cross-sections of FIG. 4, where the top of GDP 50 is oriented to the top of each figure. FIG. 5 illustrates a cross-section of FIG. 4 taken along the line D-D, through-holes 56. A channel 58 is oriented lengthwise above holes 56 and provides a route for Gas B to travel through to be distributed to each of holes 56. Gas B will generally travel from the outside edges of GDP 50 toward the center of GDP 50. The pitch p5 between holes 56 may be between about 1 mm and 10 mm, such as about 2 mm. Other values for the pitch p5 may be used. The value of pitch p6 may vary depending on the cross-section taken. The width w5 of each of holes 56 may be between about 0.1 mm and about 1 mm, such as about 0.2 mm. Other widths of holes 56 may be used. The height h5 of channel 58 may be between about 0.5 mm and about 1 mm, such as about 0.6 mm. Other heights of channel 58 may be used.

Figure 6:
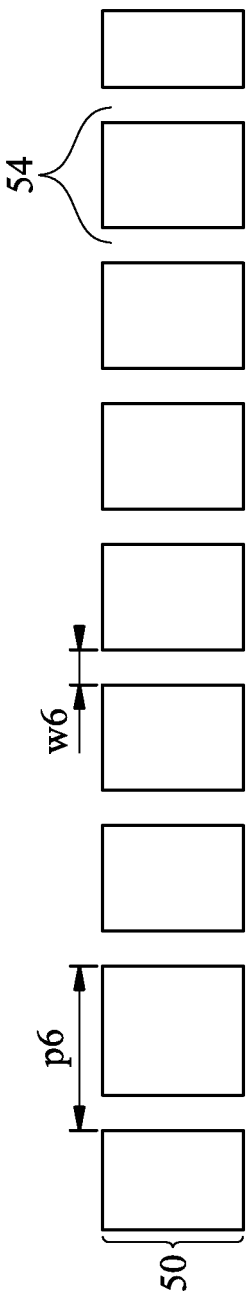

FIG. 6 illustrates a cross-section of FIG. 4 taken along the line E-E, through through-holes 54, in accordance with some embodiments. The pitch p6 between through-holes 54 may be between about 5 mm and 30 mm, such as about 10 mm. Other values for the pitch p6 may be used. The value of pitch p6 may vary depending on the cross-section taken. The width w6 of each of through-holes 54 may be between about 1 mm and about 10 mm, such as about 3 mm. Other values for the widths w6 of through-holes 54 may be used.

Figure 7:
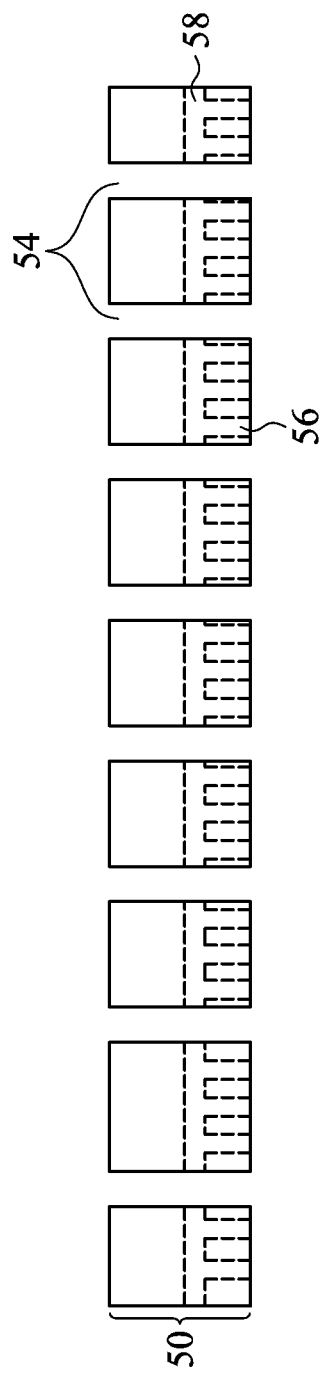

FIG. 7 illustrates a combined view of the cross-section of FIG. 5 and the cross-section of FIG. 6, in accordance with some embodiments, with the cross-section of FIG. 5 shown in dashed lines.

Figure 8:
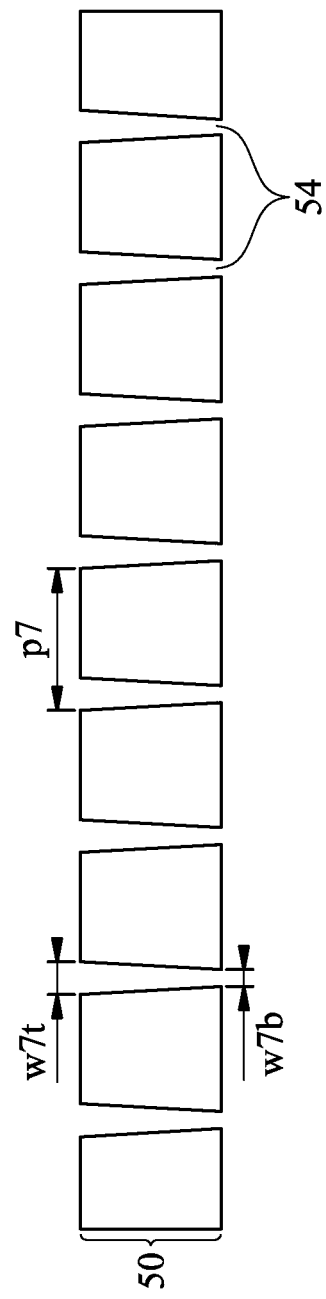

FIG. 8 illustrates a cross-section of FIG. 4 taken along the line E-E, through through-holes 54, in accordance with some embodiments. FIG. 8 illustrates that through-holes 54 may be funnel shaped. The pitch p7 at the top of through-holes 54 may be between about 5 mm and 30 mm, such as about 10 mm. Other values for the pitch p7 may be used. The value of pitch p7 may vary depending on the cross-section taken. The width w7t at the top of each of through-holes 54 may be between about 1 mm and about 10 mm, such as about 3 mm. The width w7b at the bottom of each of through-holes 54 may be between about 0.25 mm and about 2.5 mm, such as about 0.75 mm. Other values for the width w7t and width w7b of through-holes 54 may be used. Although the through-holes 54 are illustrated as being perpendicular to the top or bottom surface of GDP 50 (for example, in FIGS. 5 through 7), it should be understood that through-holes 54 may also not be perpendicular to the top or bottom surface of GDP 50, in accordance with some embodiments.

Figure 9:
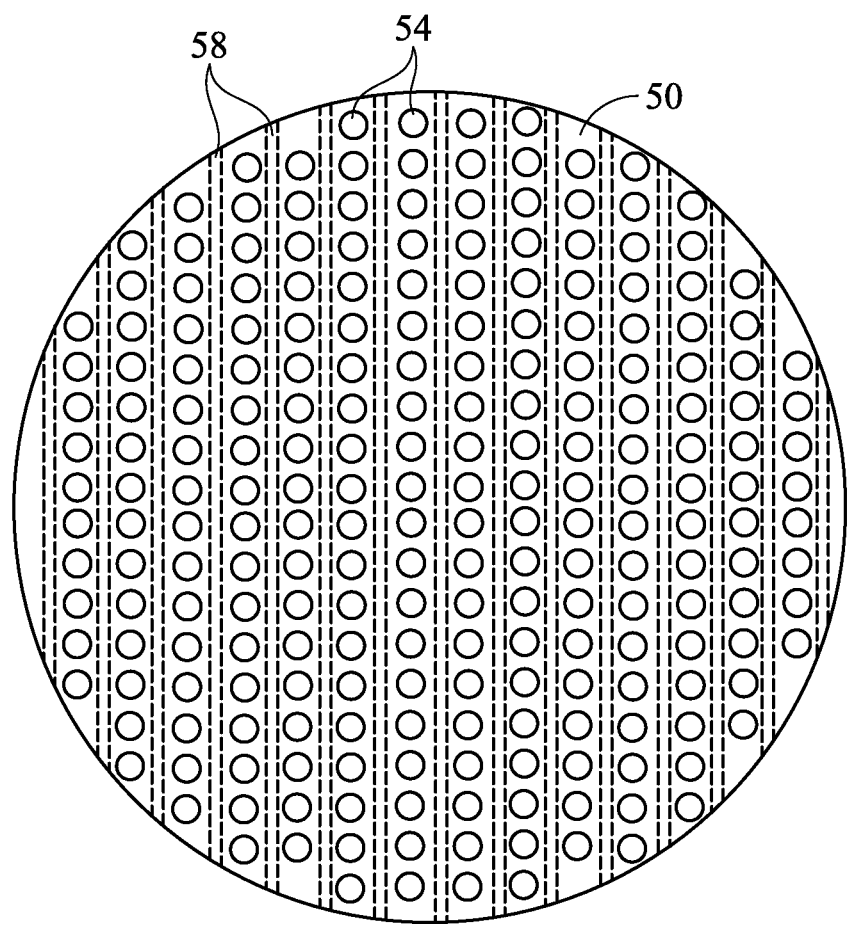

FIG. 9 is an illustration of a top-down view of GDP 50, in accordance with some embodiments. Through-holes 54 are illustrated. Channels 58 are shown in phantom by dashed lines. Although channels 58 are illustrated as extending from one side of GDP 50 to the other in parallel lines, it should be understood that other arrangements of channels 58 may be used. In some embodiments, for example, channels 58 may have a grid pattern. In some embodiments, channels 58 of GDP 50 may interface with gas channels 64 of GDP holder 52.

Figure 10:
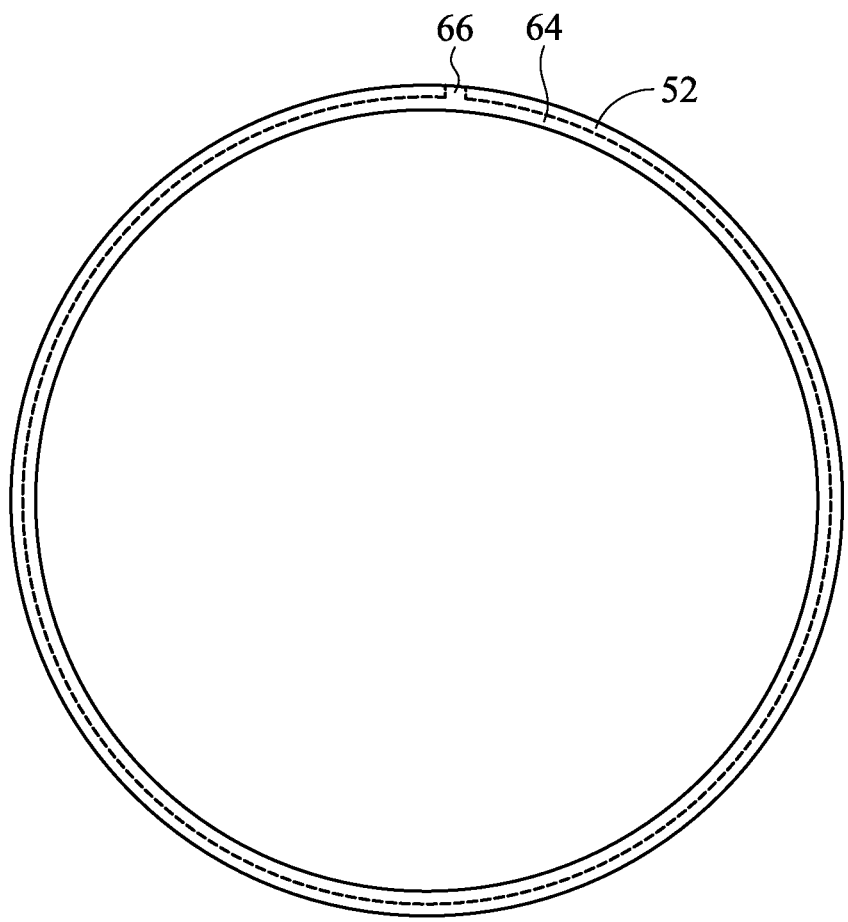
FIG. 10 illustrates a top down view of a holder for a gas distribution plate, in accordance with some embodiments.

FIG. 10 illustrates a top down view of GDP holder 52, in accordance with some embodiments. In some embodiments, GDP holder 52 may have an integrated gas channel 64 (shown in phantom by dashed lines). Gas channel 64 may be provided to supply gas (i.e., Gas B) to the edges of GDP 50 to channels 58 of GDP 50. A gas channel feed 66 may be provided to supply gas to gas channel 64. In some embodiments, gas channel 64 may be omitted and gas channel feed 66 may be provided to supply gas directly to channel feed 59a (see FIGS. 11a and 11b). In some embodiments, multiple gas channel feeds 66 may be provided around the periphery of GDP holder 52.

Figure 11A:
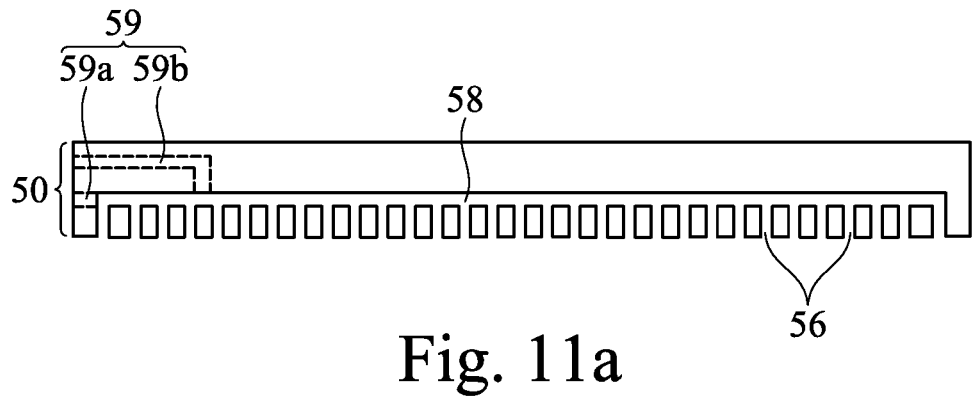
FIGS. 11a and 11b illustrate views of a gas distribution plate, in accordance with some embodiments.
Figure 11B:
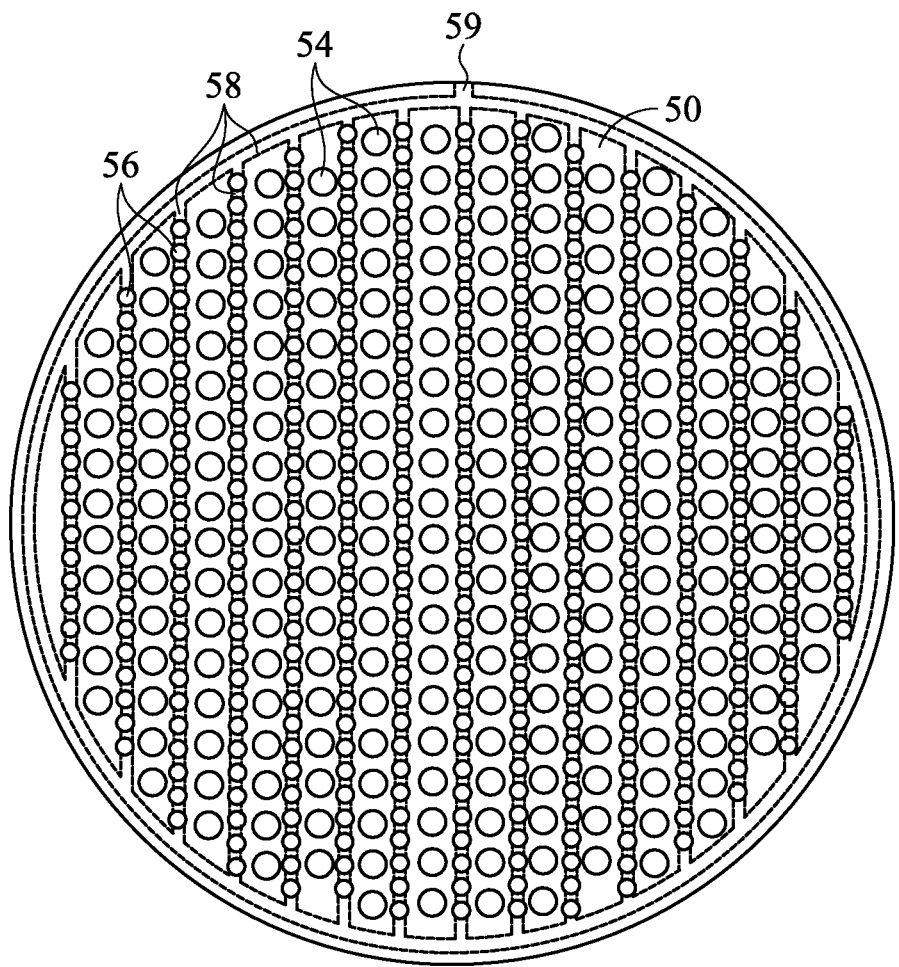

FIGS. 11a and 11b illustrate views of GDP 50, in accordance with some embodiments. In some embodiments, channels 58 are enclosed on the edges of GDP 50 and GDP 50 has an integrated channel feed 59 which may interface with gas channel feed 66 to provide gas to channels 58 and, in turn, to holes 56. As illustrated in FIG. 11a, in some embodiments, an inlet for channel feed 59a may be located in line with channel 58 and gas may be provided to channel feed 59a by gas channel feed 66 in GDP holder 52 (see FIG. 10). In some embodiments, an inlet for channel feed 59b may be located in other areas of GDP 50. In some embodiments, the inlet for channel feed 59b may be coupled directly to a gas feed and not provided through GDP holder 52.

Figure 12:
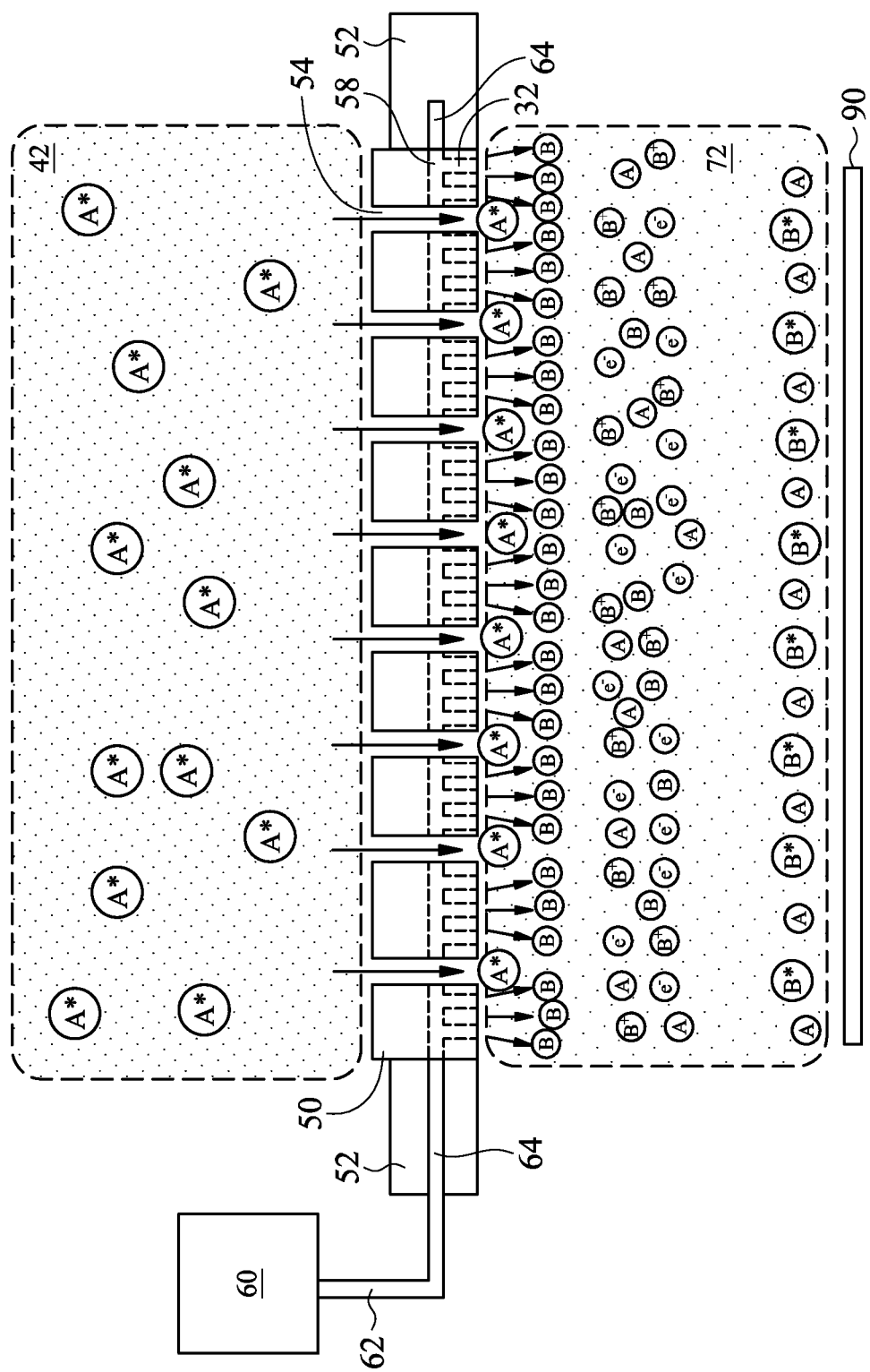
FIG. 12 illustrates a close-up view of the secondary excitation of Gas B is illustrated, in accordance with some embodiments.

Turning now to FIG. 12, FIG. 12 illustrates a close-up view of the secondary excitation of Gas B, in accordance with some embodiments. Gas A is directly excited by the energization from generating a plasma of Gas A. The energy of Gas A is reduced through GDP 30 (not shown) into low ion region 42. Radicals of Gas A, illustrated as A*, are in low ion region 42. The energy of Gas A is further reduced through GDP 50 into substrate processing region 72. As illustrated in FIG. 12, Gas B enters substrate processing region 72 in an unenergized state from holes 56. Energized radicals of Gas A entering substrate processing region 72 from low ion region 42 through through-holes 54 collide with Gas B molecules near the bottom of GDP 50. During this collision, energized radicals of Gas A transfer their energy to Gas B in a Penning Ionization to create radicals of Gas B. The Penning Ionization can be described by the following chain reaction.

$$A^*+B \rightarrow B^+ + e^- + A \qquad (eq. 1)$$

$$B^+ + e^- + A + B \rightarrow B^* + A \qquad (eq. 2)$$

In the reaction, radicals of Gas A (A*) collide with neutral molecules of Gas B (B), thereby forming cations of Gas B (B⁺), free electrons (e⁻), and neutral Gas A molecules (A), represented by equation 1 (eq. 1). Then in a further spontaneous reaction represented by equation 2 (eq. 2), the cations of Gas B ($B^k$) combine with neutral molecules of Gas B (B) and free electrons (e⁻) to form radicals of Gas B (B*). Because the excitation state of Gas A is higher than the excitation state of Gas B, radicals of Gas B (B*) form, while Gas A remains as neutral molecules (A). Moreover, the radicals of Gas B cannot have a higher excitation state than the radicals of Gas A. Therefore, high energy radicals (e.g., having an energy greater than or equal to 10 eV) of Gas B are prevented from being formed, and only lower energy radicals (e.g., having an energy less than or equal to about 5 eV) of Gas B are formed. In addition to radicals of Gas B, UV radiation and ions may also be generated.

Figure 13:
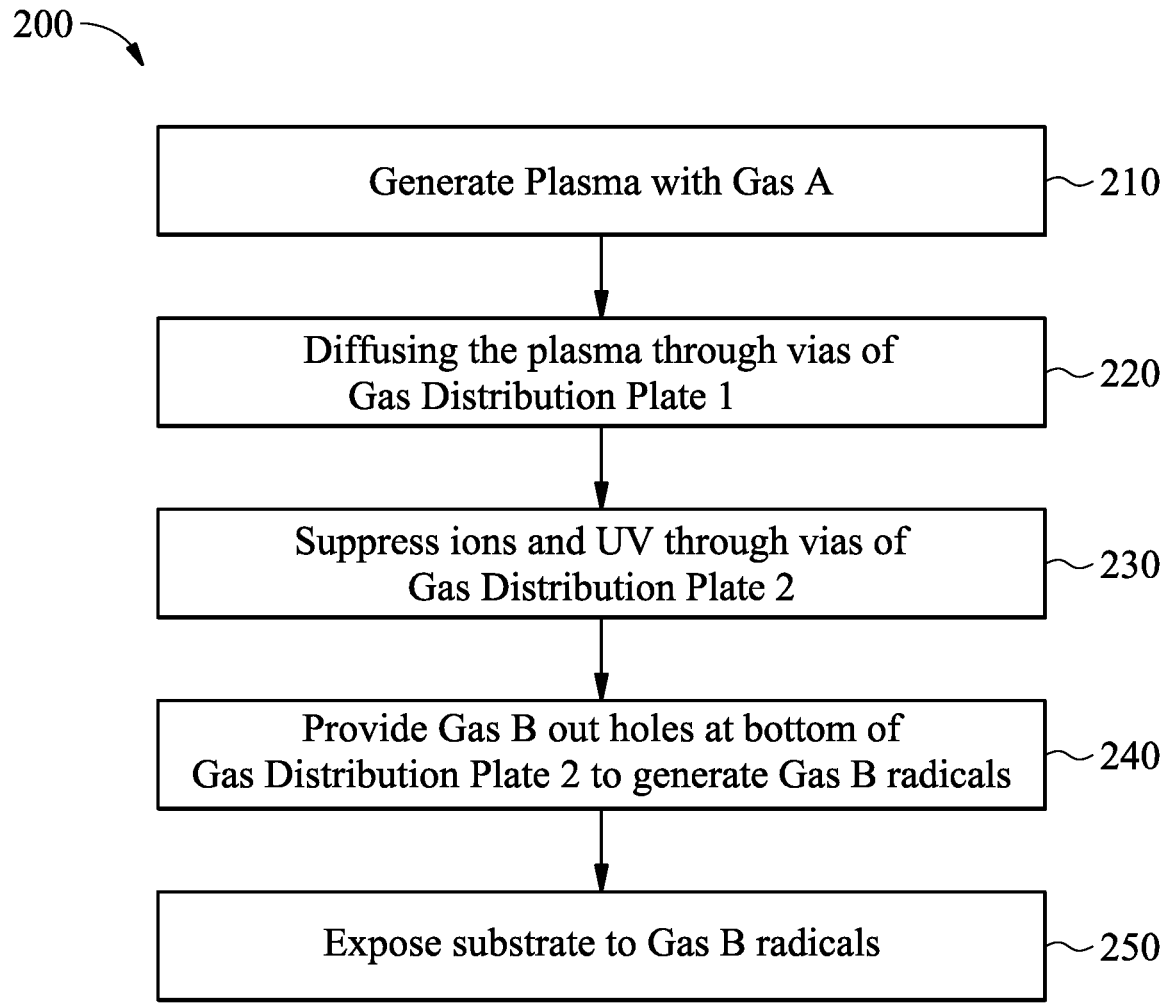
FIG. 13 illustrates a flow diagram of a method of dry ashing by secondary excitation is illustrated, in accordance with some embodiments.

Referring now to FIG. 13, FIG. 13 illustrates a flow diagram of a method 200 of dry ashing by secondary excitation is illustrated, in accordance with some embodiments. At step 210, a plasma is generated with a first gas, such as Gas A, in an ashing or etching chamber, such as chamber 10 of FIG. 1. In some embodiments, Gas A may be a non-ashing or non-etching gas, such as an inert gas. In some embodiments, Gas A may be an ashing or etching gas having multiple excitation states, such as $N_2$. Effluents of the generated plasma may include ions, radicals of species of Gas A in multiple excitation states, and UV radiation. At step 220, effluents of the plasma of Gas A are diffused through a first grounded GDP, such as GDP 30, thereby affecting the effluents of the plasma of Gas A. For example, the number of ions and amount of UV radiation will be reduced after diffusion through the first GDP, such as described above with respect to FIG. 1. Radicals of Gas A in multiple excitation states also diffuse through the first GDP, which may reduce the energy level of the radicals of Gas A and which may neutralize some of the radicals.

At step 230, the remaining effluents of the plasma of Gas A diffuse through a second GDP, such as GDP 50, thereby further affecting of the remaining effluents of the plasma of Gas A. UV radiation and ions of Gas A may be drastically reduced with between about 1% and about 6% of the total effluents of the plasma of Gas A diffusing through the second GDP. Radicals of Gas A in multiple excitation states also diffuse through the second GDP, which may further reduce the energy level of the radicals of Gas A and which may further neutralize some of the radicals.

At step 240, an unenergized species of a second gas, such as Gas B, is provided out of holes at the bottom of the second GDP. Radicals of Gas A diffusing through the second GDP collide with the unenergized Gas B species and a Penning Ionization causes the energy of the radicals of Gas A to transfer to the Gas B species, thereby forming radicals of the Gas B species. Gas B may include any suitable ashing or etching gas different from Gas A, such as oxygen ($O_2$), nitrogen ($N_2$), hydrogen ($H_2$), nitrogen trifluoride ($NF_3$), tetrafluoromethane ($CF_4$), another fluorocarbon, a hydrofluorocarbon ($C_xH_yF_z$), or combinations thereof. Other suitable ashing or etching gases may be used. Because radicals of Gas B are formed in a secondary reaction, the radicals have a lower energy than if the plasma had been created with Gas B directly, and the energy levels of the radicals are limited by the energy levels of the radicals of Gas A. As such, primarily only lower energy radicals of Gas B are formed. In some embodiments, depending on the species of the selected gasses, some high energy radicals of Gas B may also be formed, however, the number of high energy radicals of Gas B formed is less than would be if the plasma was formed from Gas B directly.

At step 250, a substrate, such as substrate 90, is exposed to the radicals of Gas B. A resist material, such as a photoresist layer or BARC layer may be disposed on the substrate and the radicals of Gas B combine with the resist material to decompose the material. Optionally, the substrate may be moved closer to or further from the second GDP to control the intensity of the decomposition. Optionally, the temperature of the substrate may be controlled by heating/cooling elements in a pedestal on which the substrate is retained during the ashing process. In some embodiments, the substrate may be exposed to the radicals of Gas B for about 30 seconds to about 300 seconds. In some embodiments, the substrate may be exposed for less time than 30 seconds or more time than 300 seconds. Due to the highly selective ashing resulting from the secondary excitation of the ashing gas, Gas B, the substrate may be exposed to Gas B without regard to exposure time, without suffering unwanted decomposition of underlying materials.

Accordingly, the method 200 decomposes the resist layer in a selective manner, thereby ashing or etching the resist layer without damaging the underlying structures to prevent unwanted loss of materials of the underlying structures. While certain embodiments of the invention have been described above, it will be recognized and understood that various modifications can be made in the invention and the appended claims are intended to cover all such modifications which may fall within the spirit and scope of the invention.

FIGS. 14 through 17 illustrate cross-sectional views of intermediate stages of a photolithography technique used to in the formation of features in a target layer 102 on a semiconductor device 100, in accordance with some embodiments. Although a description of the formation of mandrels 124 (see FIG. 17) are described below, it should be understood that the techniques described below may be used to form other types of pattern layers.

The target layer 102 is a layer in which a plurality of patterns is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

In some embodiments, the target layer 102 is an intermetal dielectric (IMD) layer. In such embodiments, the target layer 102 comprises a low-k dielectric material having a dielectric constant (k value) lower than 3.8, lower than about 3.0, or lower than about 2.5, for example. In alternative embodiments, target layer 102 is an IMD layer comprising high-k dielectric material having a k value higher than 3.8. Openings may be patterned in the target layer 102 with the embodiment processes, and conductive lines and/or vias may be formed in the openings as described below.

In some embodiments, the target layer 102 is a semiconductor substrate. The semiconductor substrate may be formed of a semiconductor material such as silicon, silicon germanium, or the like. In some embodiments, the semiconductor substrate is a crystalline semiconductor substrate such as a crystalline silicon substrate, a crystalline silicon carbon substrate, a crystalline silicon germanium substrate, a III-V compound semiconductor substrate, or the like. The semiconductor substrate may be patterned with an embodiment process, and subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (finFETs).

In some embodiments, the target layer 102 is a conductive layer, such as, a metal layer or a polysilicon layer, which is blanket deposited. Embodiment patterning processes may be applied to the target layer 102 in order to pattern semiconductor gates and/or dummy gates of finFETS. By using embodiment processes to pattern a conductive target layer 102, spacing between adjacent gates may be reduced and gate density may be increased.

Figure 14:
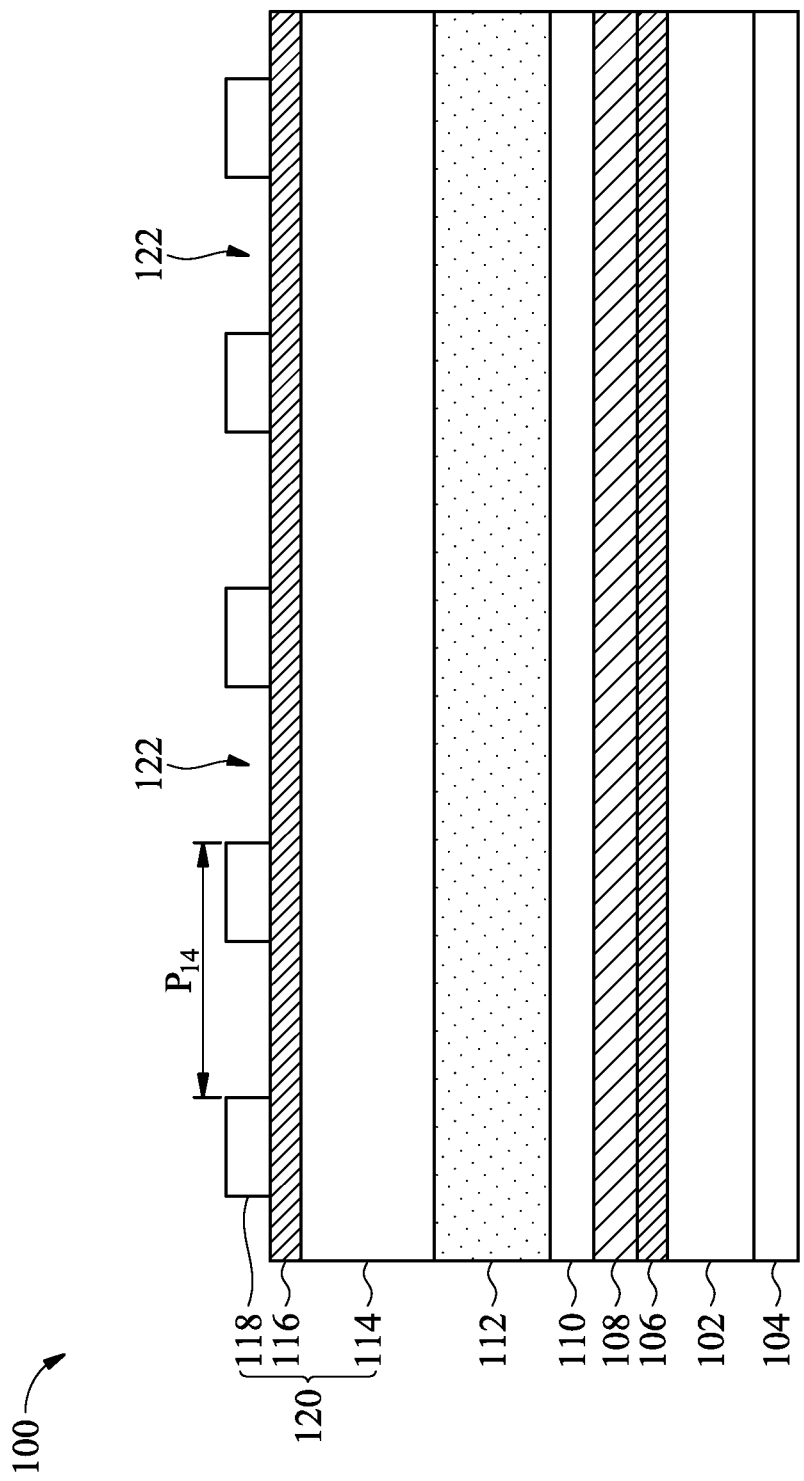
FIGS. 14 through 17 illustrate cross-sectional views of intermediate stages of a photolithography technique used to in the formation of features in a target layer on a semiconductor device, in accordance with some embodiments.

In FIG. 14, a film stack including the target layer 102 is formed in semiconductor device 100. In some embodiments, the target layer 102 may be formed over a semiconductor substrate 104. The semiconductor substrate 104 may be formed of a semiconductor material such as silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, diodes, capacitors, resistors, etc., may be formed in and/or on an active surface of semiconductor substrate 104. In other embodiments where the target layer 102 is a semiconductor substrate used to form finFETs, the semiconductor substrate 104 may be omitted.

Although FIG. 14 illustrates target layer 102 being in physical contact with semiconductor substrate 104, any number of intervening layers may be disposed between target layer 102 and semiconductor substrate 104. Such intervening layers may include an inter-layer dielectric (ILD) layer comprising a low-k dielectric and having contact plugs formed therein, other IMD layers having conductive lines and/or vias formed therein, one or more intermediary layers (e.g., etch stop layers, adhesion layers, etc.), combinations thereof, and the like. For example, an optional etch stop layer (not illustrated) may be disposed directly under the target layer 102. The etch stop layer and may act as a stop for an etching process subsequently performed on the target layer 102. The material and process used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), physical vapor deposition (PVD), or the like.

The film stack further includes an anti-reflective coating (ARC) 106 formed over the target layer 102. The ARC 106 aids in the exposure and focus of overlying photoresist layers (discussed below) during patterning of the photoresist layers. In some embodiments, the ARC 106 may be formed from SiON, silicon carbide, materials doped with oxygen (O) and nitrogen (N), or the like. In some embodiments, the ARC 106 is substantially free from nitrogen, and may be formed from an oxide. In such embodiments, the ARC 106 may be also referred to as a nitrogen-free ARC (NFARC). The ARC 106 may be formed by Plasma Enhance Chemical Vapor Deposition (PECVD), High-Density Plasma (HDP) deposition, or the like.

The film stack further includes a hard mask layer 108 formed over the ARC 106 and the target layer 102. The hard mask layer 108 may be formed of a material that comprises a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like), and may be formed by PVD, Radio Frequency PVD (RFPVD), Atomic Layer Deposition (ALD), or the like. In subsequent processing steps, a pattern is formed on the hard mask layer 108 using an embodiment patterning process. The hard mask layer 108 is then used as an etching mask for etching the target layer 102, where the pattern of the hard mask layer 108 is transferred to the target layer 102.

The film stack further includes a dielectric layer 110 formed over the hard mask layer 108. The dielectric layer 110 may be formed from a silicon oxide, such as borophosphosilicate tetraethylortho silicate (BPTEOS) or undoped tetraethylorthosilicate (TEOS) oxide, and may be formed by CVD, ALD, spin-on coating, or the like. In some embodiments, the dielectric layer 110 acts as an etch stop layer for patterning subsequently formed mandrels and/or spacers (e.g., mandrels 124, see FIG. 17). In some embodiments, the dielectric layer 110 also acts as an anti-reflective coating.

The film stack further includes a mandrel layer 112 formed over the first dielectric hard mask layer 108. Mandrel layer 112 may be formed of a semiconductor such as amorphous silicon, polysilicon, silicon nitride, silicon oxide, or another material that has a high etching selectivity with the underlying layer, e.g., with the dielectric layer 110.

A tri-layer photoresist 120 is formed on the film stack over the mandrel layer 112. The tri-layer photoresist 120 includes a bottom layer 114, a middle layer 116 over the bottom layer 114, and an upper layer 118 over the middle layer 116. The bottom layer 114 and upper layer 118 may be formed of photoresists (e.g., photosensitive materials), which include organic materials. In some embodiments, the bottom layer 114 may also be a bottom anti-reflective coating (BARC) layer. The middle layer 116 may comprise an inorganic material, which may be a nitride (such as silicon nitride), an oxynitride (such as silicon oxynitride), an oxide (such as silicon oxide), or the like. The middle layer 116 has a high etching selectivity relative to the upper layer 118 and the bottom layer 114. The various layers of the tri-layer photoresist 120 may be blanket deposited sequentially using, for example, spin-on processes. Although a tri-layer photoresist 120 is discussed herein, in other embodiments, the photoresist 120 may be a monolayer or a bilayer (e.g., comprising only the bottom layer 114 and the upper layer 118 without the middle layer 116) photoresist. The type of photoresist used (e.g., monolayer, bilayer, or tri-layer) may depend on the photolithography process used to pattern the mandrel layer 112. For example, in advanced extreme ultraviolet (EUV) lithography processes, a monolayer or bilayer photoresist 120 may be used.

In some embodiments, the upper layer 118 is patterned using a photolithographic process. The pattern of the upper layer 118 may be evaluated for accuracy. If the pattern of the upper layer 118 is determined to be faulty, the upper layer 118 may be removed by an ashing technique, such as the method 200 of ashing using an ashing or etching chamber such as chamber 10, described above. The upper layer 118 of the tri-layer may be reapplied and re-patterned. In embodiments using a monolayer or bilayer photoresist, the topmost layer may be removed, reapplied, and re-patterned without damaging the underlying resist layers or underlying target layers.

Figure 15:
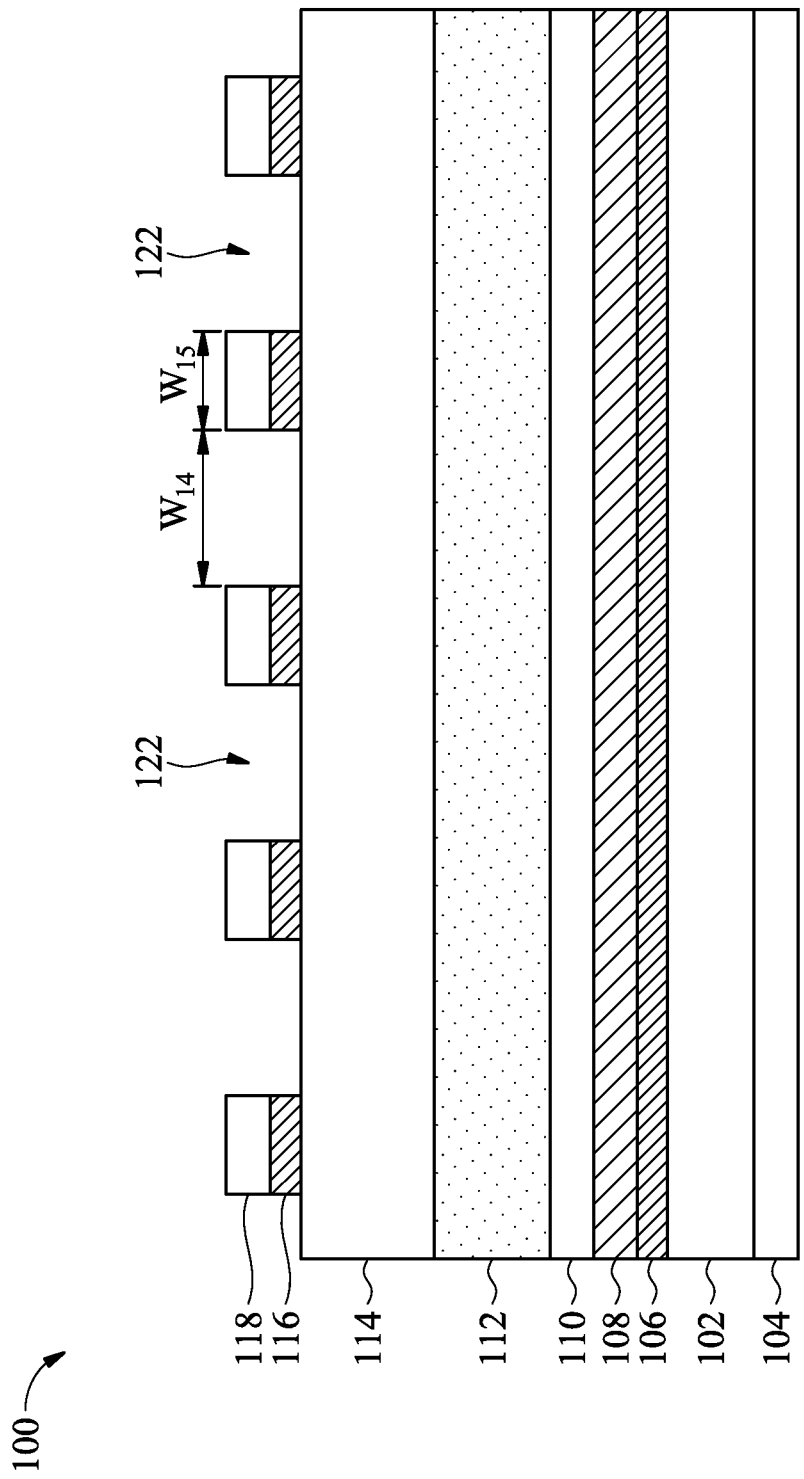

Subsequently, when the upper layer 118 is evaluated as non-faulty, the upper layer 118 is used as an etching mask for patterning of the middle layer 116 (see FIG. 15). The middle layer 116 is then used as an etching mask for patterning of the bottom layer 114, and the bottom layer 114 is then used to pattern the mandrel layer 112 (see FIGS. 16 and 17). It has been observed that by using a tri-layer photoresist (e.g., tri-layer photoresist 120) to etch a target layer (e.g., mandrel layer 112), improved definition in fine-pitched patterns can be achieved in the target layer (e.g., mandrel layer 112).

The upper layer 118 is patterned using any suitable photolithography process to form openings 122 therein. As an example of patterning openings 122 in the upper layer 118, a photomask (not shown) may be disposed over the upper layer 118. The upper layer 118 may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 118. Exposure of the top photoresist layer may be performed using an immersion lithography system to increase resolution and decrease the minimum achievable pitch. A bake or cure operation may be performed to harden the upper layer 118, and a developer may be used to remove either the exposed or unexposed portions of the upper layer 118 depending on whether a positive or negative resist is used. The openings 122 may have strip shapes in a plan view (not illustrated). The pitch $P_{14}$ of the openings 122 may be the minimum pitch achievable using photolithographic processes alone. For example, in some embodiments, the pitch $P_{14}$ of the openings 122 is about 80 nm. Other pitches $P_{14}$ of the openings 122 are also contemplated.

After the patterning of the upper layer 118, the pattern of the upper layer 118 is transferred to the middle layer 116 in an etching process. The etching process is anisotropic, so that the openings 122 in the upper layer 118 are extended through the middle layer 116 and have about the same sizes in the middle layer 116 as they do in the upper layer 118. The resulting structure is illustrated in FIG. 15.

Optionally, a trimming process (not illustrated) may be performed to increase the size of the openings 122 in the middle layer 116. In an embodiment, the trimming process is an anisotropic plasma etch process with process gases including $O_2$, $CO_2$, $N_2/H_2$, $H_2$, the like, a combination thereof, or any other gases suitable for trimming the middle layer 116. The trimming may increase the width $W_{14}$ of the openings 122 and decrease the width $W_{15}$ of the portions of the middle layer 116 between the openings 122. The trimming process may be performed in order to achieve a desired ratio of the width $W_{14}$ to the width $W_{15}$ so that subsequently defined lines are uniformly spaced. In other embodiments, the middle layer 116 is initially patterned to have a desired ratio of the width $W_{14}$ to the width $W_{15}$ and the trimming process may be omitted.

Figure 16:
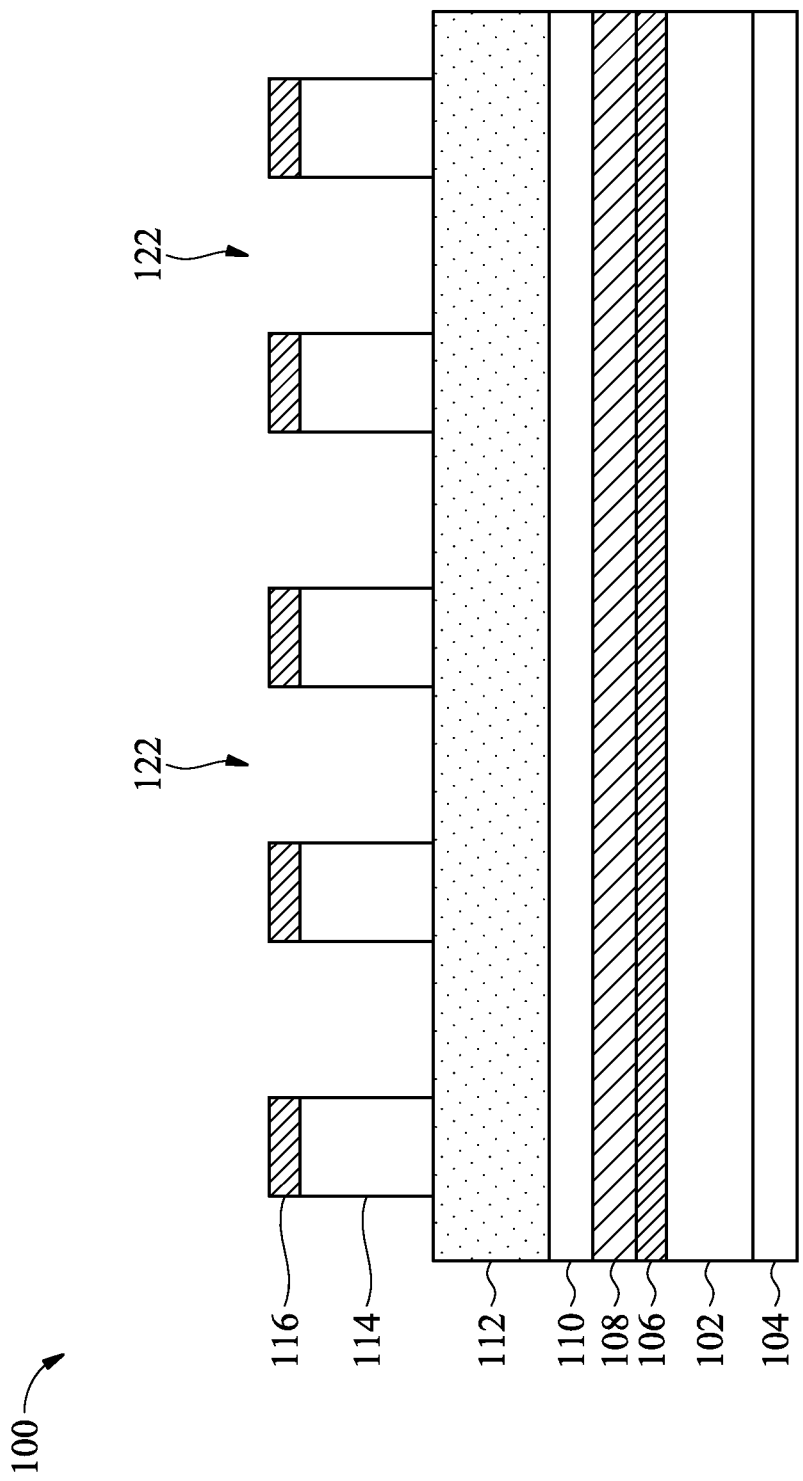

In FIG. 16, an etching process is performed to transfer the pattern of the middle layer 116 to the bottom layer 114, thereby extending the openings 122 through the bottom layer 114. The etching process of the bottom layer 114 is anisotropic, so that the openings 122 in the middle layer 116 are extended through the bottom layer 114 and have about the same sizes in the middle layer 116 as they do in the bottom layer 114. As part of etching the bottom layer 114, the upper layer 118 (see FIGS. 15 and 15) may be consumed.

Figure 17:
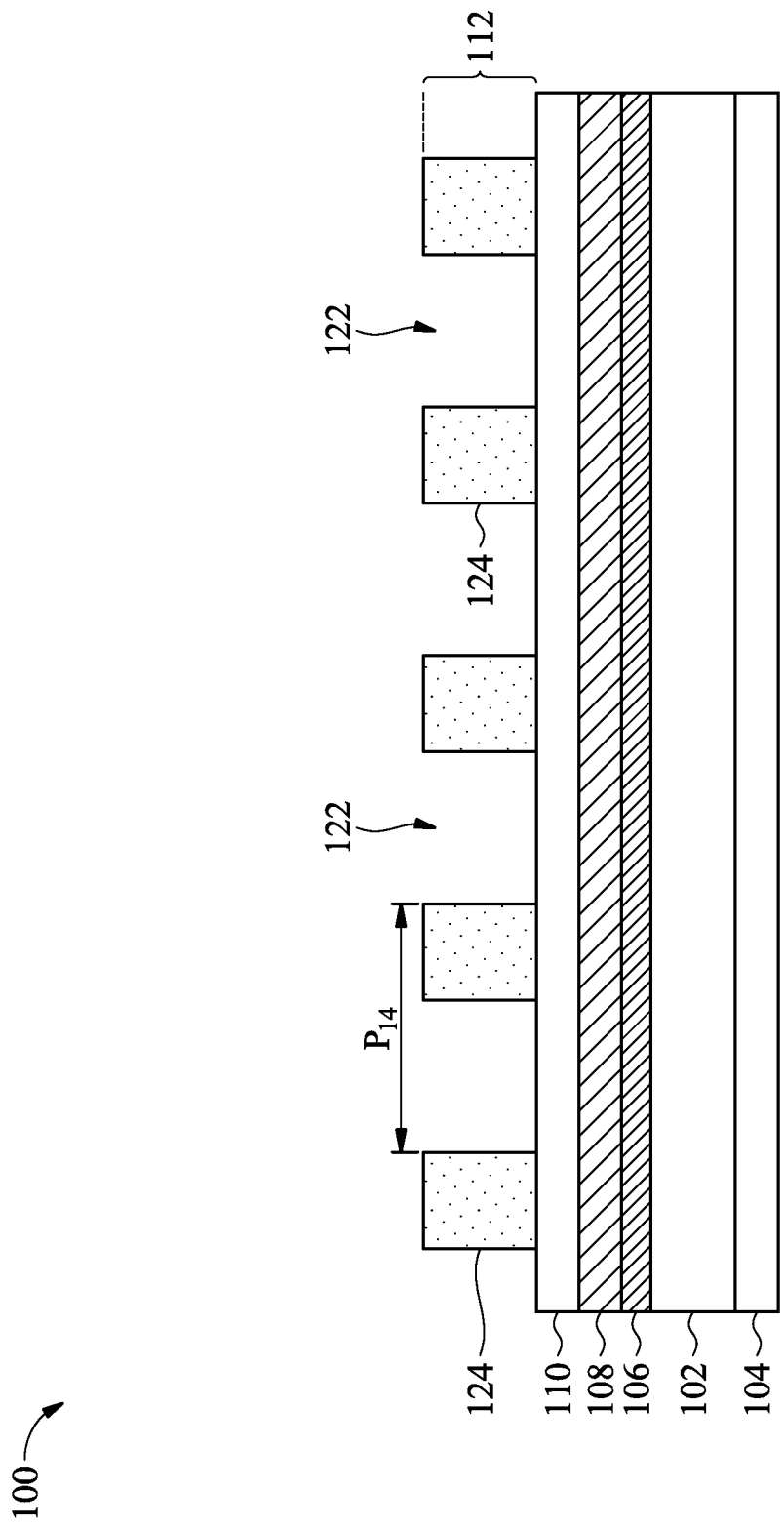

In FIG. 17, the pattern of the bottom layer 114 (see FIG. 16) is transferred to the mandrel layer 112 using an etching process. The etching process of the mandrel layer 112 is anisotropic, so that the openings 122 in the bottom layer 114 are extended through the mandrel layer 112 and have about the same sizes in the mandrel layer 112 as they do in the bottom layer 114. Thus, mandrels 124 are defined from remaining portions of the mandrel layer 112 (e.g., portions of mandrel layer 112 between openings 122). The mandrels 124 have a pitch $P_{14}$ (see also FIG. 14). In some embodiments, pitch $P_{14}$ is a minimum pitch achievable using photolithographic processes. During etching the mandrel layer 112, the middle layer 116 is consumed, and bottom layer 114 may be at least partially consumed.

In embodiments when the bottom layer 114 is not completely consumed while etching the mandrel layer 112, an ashing process, such as the ashing or etching method 200 described above, may be performed to remove remaining residue of the bottom layer 114.

Embodiments provide an ashing process and device which forms radicals of an ashing gas through a secondary reaction, thereby preventing or reducing high energy radicals of an ashing gas. Whereas a typical ashing process to remove a resist layer may damage underlying layers of a resist layer by the presence of high energy radicals of an ashing gas, embodiments provide an ashing process in which an ashing gas is excited in a secondary reaction. Thus, high energy radicals of the ashing gas which may damage underlying structures are prevented from being formed.

One embodiment is a method, including generating a first plasma from a first gas. The first plasma is diffused, in a wafer processing chamber, through a first gas distribution plate (GDP), forming a first low energy region. The first plasma is diffused from the first low energy region through a second GDP, forming a substrate processing region. A second gas is supplied in the substrate processing region, where the first plasma energizes the second gas to form radicals of the second gas, where the radicals of the second gas strip a layer from a substrate.

Another embodiment is a method including generating a plasma from a first gas. The method also includes passing, in a wafer processing chamber, a first percentage of the plasma through a first gas distribution plate (GDP). The method further includes passing a second percentage of the first percentage of the plasma through a second GDP into a first area of the wafer processing chamber. A second gas is supplied to the first area of the wafer processing chamber, where radicals of the first gas from the second percentage collide with the second gas to energize the second gas. A wafer is exposed to the energized second gas.

Another embodiment is a chamber, including a plasma source generator, a first gas source, a first gas distribution plate (GDP), a second gas source, a second GDP, and a pedestal. The first GDP is disposed between the plasma source generator and the second GDP. The second GDP is disposed between the first GDP and the pedestal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   generating a first plasma from a first gas;
   diffusing, in a wafer processing chamber, the first plasma through a first gas distribution plate (GDP), forming a first low energy region;
   diffusing the first plasma from the first low energy region through a second GDP, forming a substrate processing region; and
   supplying a second gas in the substrate processing region, wherein the first plasma energizes the second gas to form radicals of the second gas, wherein the radicals of the second gas strip a layer from a substrate.

2. The method of claim 1, wherein the substrate is positioned on a pedestal, the method further comprising moving the pedestal closer to or further from the second GDP.

3. The method of claim 1, wherein the first gas is an inert gas or nitrogen ($N_2$).

4. The method of claim 3, wherein the second gas is gas other than the first gas, and wherein the second gas comprises $O_2$, $N_2$, $H_2$, nitrogen trifluoride ($NF_3$), tetrafluoromethane ($CF_4$), another fluorocarbon, a hydrofluorocarbon ($C_xH_yF_z$), or combinations thereof.

5. The method of claim 1, wherein the second gas is energized by a Penning Ionization.

6. The method of claim 1, wherein the first GDP and second GDP comprise a conductive material and wherein the first GDP and second GDP are grounded.

7. The method of claim 1, wherein the second GDP comprises a first set of holes traversing the second GDP from top to bottom, wherein the second GDP comprises a second set of holes, the second set of holes supplying the second gas.

8. The method of claim 7, wherein the second set of holes are substantially uniformly distributed across a bottom of the second GDP.

9. The method of claim 7, wherein the second set of holes interfaces with a channel internally disposed within the second GDP, the channel coupled to a source for the second gas.

10. A method, the method comprising:
generating a plasma from a first gas;
passing, in a wafer processing chamber, a first percentage of the plasma through a first gas distribution plate (GDP);
passing a second percentage of the first percentage of the plasma through a second GDP into a first area of the wafer processing chamber;
supplying the first area of the wafer processing chamber with a second gas, wherein radicals of the first gas from the second percentage collide with the second gas to energize the second gas; and
exposing a wafer to the energized second gas.

11. The method of claim 10, wherein the wafer has disposed thereon, prior to supplying the first gas, a resist layer, wherein exposing the wafer to the energized second gas removes the resist layer, wherein exposing the wafer to the energized second gas does not erode material underlying the resist layer.

12. The method of claim 10, wherein the first percentage is about 10% to about 30% and wherein the second percentage is about 10% to about 20%.

13. The method of claim 10, wherein the first GDP has a first plurality of through-holes formed therein, wherein the first plurality of through-holes have multiple different widths.

14. The method of claim 10, wherein the second gas is supplied through the second GDP.

15. A method comprising:
supplying a first gas to an upper region of a processing chamber;
energizing the first gas to form first energized species, the first energized species comprising first ions of the first gas, first radicals of the first gas, or combinations thereof;
passing the first energized species through a first plate to a lower region of the processing chamber;
while passing the first energized species through the first plate, supplying a second gas proximate to the first energized species, the first energized species interacting with the second gas to form a second energized species, the second energized species comprising second ions of the second gas, second radicals of the second gas, or combinations thereof; and
supplying the second energized species to a wafer, the second energized species removing a coating disposed on the wafer.

16. The method of claim 15, further comprising:
moving the wafer up or down by a pedestal to control an intensity of the second energized species on the coating.

17. The method of claim 15, wherein supplying the second gas further comprises:
supplying the second gas to the first plate; and
dispersing the second gas from holes formed in an underside of the plate.

18. The method of claim 15, further comprising:
prior to passing the first energized species through the first plate, passing the first energized species through a second plate to a middle region of the processing chamber, thereby reducing an intensity of the first energized species.

19. The method of claim 15, wherein the first plate includes a plurality of through-holes, wherein the first plate is grounded, wherein a first portion of the first energized species passes through the plurality of through-holes and a second portion of the first energized species strikes the first plate and is neutralized.

20. The method of claim 19, wherein the plurality of through-holes of the first plate are funnel shaped.

* * * * *